United States Patent [19]

Nishikubo et al.

[11] 3,878,076

[45] Apr. 15, 1975

[54] PHOTOCURABLE COMPOSITION AND A METHOD OF PREPARING SAME

[75] Inventors: Tadatomi Nishikubo; Masahiko Kishida; Masakazu Imaura, all of Fujisawa, Japan

[73] Assignee: Nippon Oil Seal Industry Co., Ltd., Kanagawa-ken, Japan

[22] Filed: June 13, 1973

[21] Appl. No.: 369,547

[30] Foreign Application Priority Data

June 16, 1972 Japan ............................... 47-59461

[52] U.S. Cl. ........ 204/159.15; 96/115 R; 96/115 P; 260/31.2 XA; 260/75 UA; 260/872; 204/159.18; 204/159.19

[51] Int. Cl. ............................ C01j 1/10; C01j 1/12

[58] Field of Search .............. 96/115 R; 204/159.19; 260/75 UA, 75 EP, 31.2 XA, 872; 234/159.18

[56] References Cited

UNITED STATES PATENTS

| | | | |
|---|---|---|---|
| 3,089,863 | 5/1963 | Hicks et al. | 260/75 EP |
| 3,213,067 | 9/1965 | Pohl et al. | 260/75 EP |
| 3,254,060 | 5/1966 | Connolly et al. | 260/75 EP |
| 3,455,801 | 7/1969 | D'Alelio | 204/159.19 |
| 3,485,732 | 12/1969 | D'Alelio | 204/519.19 |
| 3,485,733 | 12/1969 | D'Alelio | 204/159.19 |
| 3,719,728 | 3/1973 | Mirnada et al. | 260/75 UA |

*Primary Examiner*—Norman G. Torchin
*Assistant Examiner*—J. P. Brammer
*Attorney, Agent, or Firm*—Holman & Stern

[57] ABSTRACT

A photocurable composition and a method of preparing the composition are disclosed. The composition includes (a) a polyester having a photopolymerizable group in its side chains, obtained by a ring-opening alternating copolymerization of a glycidyl ester of a photopolymerizable $\alpha$, $\beta$-unsaturated carboxylic acid and a carboxylic acid anhydride, and (b) a photopolymerization initiator. The composition may also include a photopolymerizable monomer.

5 Claims, No Drawings

PHOTOCURABLE COMPOSITION AND A METHOD OF PREPARING SAME

BACKGROUND AND SUMMARY OF THE INVENTION

The present invention relates to a photocurable composition and a method of preparing the composition. More particularly, the present invention relates to a photocurable composition including a polyester having a photopolymerizable group in its side chains and a method of preparing the composition.

An unsaturated polyester obtained from maleic acid anhydride, fumaric acid, etc. and a polyol such as polypropylene glycol does not provide a good photocurable composition so that, in general, a substantial photocure of such compositions is normally carried out by adding a photopolymerizable monomer, such as styrene and a photopolymerization initiator to the polyester. However, the curing speed of the photocurable composition including styrene as an ingredient thereof is not very high, so that the polymerizing speed of styrene when used as a photopolymerizable monomer is quite low.

Thus, it is not advantageous to use such compositions in photocurable materials such as adhesives, paints, varnishes and printing inks, which require a high speed cure. In general, there are employed as photopolymerizable monomers in such photocurable compositions, acrylates or methacrylates, especially polyfunctional acrylates, these materials being preferred in view of their crosslinking speed and boiling point. However, the crosslinking reaction speed of the above mentioned unsaturated polyester, when using these esters as a photopolymerizable monomer, is lower than in the case where styrene is employed as a photopolymerizable monomer, due to a different monomer reactivity ratio between the unsaturated polyester and these esters. Therefore, the crosslinking density of the composition is low, i.e., the cure speed is low. Further, when a photopolymerization initiator is added to other unsaturated polyesters known in the market, their curing speed is relatively low.

By the present invention, there is provided a photocurable composition which overcomes these disadvantages of prior art compositions, with the present photocurable composition including an acrylate or a methacrylate as a photopolymerizable monomer. In the compositions of the preesent invention there is employed a polyester having a photopolymerizable group in its side chains as a primary photocurable ingredient of the photocurable composition, such as polyester being obtained by ring-opening alternating copolymerizing a glycidyl ester of a photopolymerizable $\alpha,\beta$-unsaturated carboxylic acid with a carboxylic acid anhydride.

Thus the present invention relates to a photocurable composition which includes (a) a polyester having a photopolymerizable group in its side chains, obtained by ring-opening alternating copolymerizing a glycidyl ester of a photopolymerizable $\alpha,\beta$-unsaturated carboxylic acid with a carboxylic acid anhydride, (b) a photopolymerization initiator, and, as required, (c) a photopolymerizable monomer. When the polyester has a low viscosity, for example, not more than 1000 poise, there need be added to the polyester, in order to complete the photocurable composition, only a photopolymerization initiator. In general, however, a photopolymerizable monomer is also added. The photocurable composition, including the photopolymerizable monomer may advantageously be obtained by adding a photopolymerization initiator to an acrylate or methacrylate solution of a polyester having a photopolymerizable group in its side chains, prepared by ring-opening alternating copolymerizing a glycidyl ester of a photopolymerizable $\alpha,\beta$-unsaturated carboxylic acid with a carboxylic acid anhydride.

DESCRIPTION OF THE PREFERRED EMBODIMENTS

As a glycidyl ester of a photopolymerizable $\alpha,\beta$-unsaturated carboxylic acid, there may be employed glycidyl acrylate, glycidyl methacrylate, glycidyl crotonate or glycidyl cynnamate. A portion of these esters may be substituted by other monoepoxy compounds such as phenylglycidylether, butylglycidylether, Carjula-E (Shell Co., glycidyl ester of a higher fatty acid), Adecaglycilol-ED501 (Asahidenca Co., alkyleneglycol monoglycidylether), vinylcyclohexenemonoepoxide, butadiene monoepoxide, styreneoxide, epichlorhydrin, methylepichlorhydrin or glycidyl benzoate. As a carboxylic acid anhydride reacting with these epoxy compounds, the anhydrides of succinic acid, phthalic acid, chlorendic acid, trimellitic acid, pyromelliltic acid, nadic acid, methyl nadic acid, tetrahydrophthalic acid, hexahydrophthalic acid and tetrachlorophthalic acid may be employed.

The epoxy compound and the carboxylic acid anhydride are ring-opening copolymerized, and the reaction is preferably carried out in the presence of a catalyst, such as, for example, a tetra ammonium salt compound such as methyltriethylammonium iodide or benzyltriethylammonium chloride or a triamine compound such as triethylamine or N,N-dimethylaniline. In addition, a small amount of a thermal polymerization inhibitor, for example, benzoquinone, anthraquinone, hydroquinone, hydroquinonemonomethylether, guaiacol, resorcinol cupric oxide, or cupferron, is added to the reaction system in order to prevent thermal polymerization and to increase the stability of the reaction. Preferred amounts to be employed include the catalyst in amounts of 0.2–15 percent by weight of the total reaction system and the inhibitor in an amount of 0.01–10 by weight of the total reaction system.

Inasmuch as ring-opening copolymerization is an exothermic reaction, it is generally difficult to control the reaction temperature when the reaction is carried out without a solvent, and particularly when the scale of the reaction is increased, this tendency is quite noticeable. But when the photopolymerizable monomer used as an ingredient of the composition is employed as a reaction solvent, the reaction temperature can be readily controlled. The photopolymerizable monomer used as the reaction solvent is not involved in the ring-opening copolymerization, but acts only as the solvent. Therefore, the polyester solution obtained by this method can be used directly as a photocurable composition by adding thereto the photopolymerization initiator. Furthermore, the viscosity of the composition can be easily controlled by varying the kinds and amounts of the solvent.

Although various photopolymerizable monomers can be used as the reaction solvents, it is extremely desirable to use an acrylate or methacrylate monomer which characteristically has a high photocuring speed. Moreover, the reaction is generally carried out in an atmosphere of air and, when the acrylate or the methacrylate is used as the reaction solvent, the inhibiting effect on thermal polymerization by the influence of oxygen is greater than in the case where a solvent such as styrene is employed. Therefore, it is preferable to use the first described esters as the reaction solvent from the view-point of reactivity. Examples of these esters include alkylacrylate, mono- or polyethyleneglycol diacrylate, propyleneglycol diacrylate, trimethylolpropane triacrylate, pentaerithritol tetra-acrylate, dipentaerithritol hexacrylate, tripentaerithritol octaacrylate, and the corresponding methacrylates. As photopolymerizable monomers, other than acrylates or methacrylates, there may be employed dialkylmaleate, dialkylfumarate, alkylcrotonate, dialkylitaconate, alkylsorbate, diallylmaleate, diallylphthalate, styrene, divinylbenzene, vinylacetate, N-vinylpyrrolidone, n-butoxymethylol acrylamide or triallylisocyanulate, used independently or in combination. The amount of the photopolymerizable monomer employed is preferably up to about 70 percent by weight of total composition.

The viscosity of the polyester obtained can be adjusted by varying not only the kinds and amounts of the solvent, but also by selecting and mixing several kinds of epoxy compounds and carboxylic acid anhydrides as the starting materials. The viscosity of the composition is preferably from 1 to 10,000 poise. Photopolymerizable monomers having allyl groups can not be used as the reaction solvent since polymerization is initiated by oxygen in the atmosphere in such a case and provides a gel. Therefore, in the case where such a photopolymerizable monomer is employed as an ingredient of the composition, the method for obtaining the desired composition requires that, after preparing the polyester, the photopolymerizable monomer is added thereto. In other words, in this case, the reaction must be carried out without a solvent, and at that time, the viscosity of the obtained polyester may be adjusted by properly selecting the kinds of the starting materials. As a specific example, the polyester obtained by reacting glycidyl methacrylate with phthalic acid anhydride or chlorendic acid anhydride has high viscosity, but if succinic acid anhydride is substituted for the above acid anhydride, the obtained polyester has a lower viscosity than that of the former polyester.

Preparation of the photocurable composition is completed by adding to the polyester the photopolymerization initiator and the photopolymerizable monomer. As photopolymerization initiators there may be employed 2-alkylanthraquinone, benzoin, benzoinether, benzoinester, benzointhioether, decylchloride, benzoinether-Michler's ketone or N,N-dialkylaniline-alkyl helide, used independently or in combination. The amount of these photopolyermization initiators to be employed is preferably from about 0.01 to 5 percent by weight of the curable ingredients, and when coloring agents such as pigments are added to the photocurable composition, an amount of the initiator of from about 7 to 15 percent by weight of the curable ingredients is preferable.

The photocurable composition according to this invention is extremely stable even after the addition of the photopolymerization initiator. Although the stability of the composition will vary according to the kind of polyester which is employed, the composition is generally stable over periods of several months under shielding from light at room temperature, the good stability of the composition being caused by the acid value of the polyester or of the varnish including the polyester, i.e., by the existence of free carboxylic groups. This characteristic of excellent stability is very important in practical use.

The photocurable composition according to this invention is rapidly cured by exposing the composition to light for a time period which varies from less than 1 second to several seconds, depending on the composition. Such compositions can be used for paintings, adhesive, printing inks and similar uses. When the composition is used for printing inks, it shows an excellent adaptability for offset printings, due to the fact that the polyester as the curable ingredient has no hydroxy group in its side chains.

The present invention is further illustrated by the following examples.

EXAMPLE 1

74 g. of phthalic acid anhydride (0.5 mole) and 64 g. of glycidyl acrylate (0.5 mole) were added to 60 g. of trimethylolpropane triacrylate, and 0.5 g. of benzyl triethylammonium chloride as a catalyst and 0.1 g. of hydroquinone monomethylether as a thermalpolymerization inhibitor were added to the mixture, after which the components were reacted at from 100°C to 120°C for 2 hours. The obtained varnish had an acid value of 23.6 and a viscosity of 3200 poise at 24°C.

The photocurable composition was completed in the following manner: 1 part by weight of trimethylolpropane triacrylate (in Experiment No. 1, this monomer was not added, and in Experiment No. 7, 1 part by weight of ethyleneglycol diacrylate was added in place of trimethylolpropane triacrylate), 1 part by weight of benzoinethylether (In Experiment No. 1, an amount used of benzoinethylether was 2 percent by weight of the varnish, and in Experiment No. 7, 1 part by weight of benzoin isobuthylether was added in place of benzoinethylether.) and 1 part by weight of the coloring agent were added to 7 parts by weight of the varnish.

After the obtained composition was coated on a tin plate to give a film thickness of 30$\mu$, it was exposed to a 500 watt high pressure mercury lamp (Ushio Electric Inc. : USH-500D) at a distance of 30 cm., and the curing time was measured. The obtained results are shown in the following Table 1.

Table 1

| Experiment No. | Coloring Agent | Curing Time (Sec) |
|---|---|---|
| 1 | — | 0.3 |
| 2 | carmine lake | 0.2 – 0.5 |
| 3 | hansa yellow | do. |
| 4 | victoria blue | do. |
| 5 | phthalocyanine blue | 0.7 – 1.0 |
| 6 | carbon black | do. |
| 7 | carmine lake | 0.2 –0.5 |

Further, the photocurable composition comprising 9.8 parts by weight of the varnish and 0.2 part by weight of benzoinethylether was prepared, and this composition was coated on the end of one sheet of glass of 24 mm. width to give a film thickness of 30$\mu$ and another sheet of the same size was placed over a length of 24 mm. on the end of the sheet. Then these were exposed to a 500 watt high pressure mercury lamp for 5 seconds. As a result, the two sheets were firmly adhered to each other to the extent that the two sheets did not easily peel off each other by pulling them from both sides longitudinally by hand.

EXAMPLE 2

74 g. of phthalic acid anhydride (0.5 mole) and 71 g. of glycidyl methacrylate (0.5 mole) were added to 62 g. of trimethylolpropane triacrylate, and 0.5 g. of benzyl triethylammonium chloride as a catalyst and 0.1 g. of hydroquinone monomethylether as a thermalpolymerization inhibitor were added to the mixture, and they were reacted at from 100°C to 120°C for 2 hours. The obtained varnish had an acid value of 29.8 and a viscosity of 2900 poise at 24°C.

The photocurable composition was completed in the following manner: 1 part by weight of trimethylolpropane triacrylatae (In Experiment No. 1, this monomer was not added.), 1 part by weight of benzoinethylether (In Experiment No. 1, an amount used of benzoinethylether was 2 percent by weight of the varnish.) and 1 part by weight of the coloring agent were added to 7 parts by weight of the varnish.

After the obtained composition was coated on a tin plate to give a film thickness of 30 μ, it was exposed to a 500 watt high pressure mercury lamp at a distance of 30 cm., and the curing time was measured. The obtained results are shown in Table 2.

Table 2

| Experiment No. | Coloring Agent | Curing Time (Sec) |
|---|---|---|
| 1 | — | 0.3 |
| 2 | carmine lake | 0.3 – 0.5 |
| 3 | hansa yellow | do. |
| 4 | victoria blue | 0.3 – 0.5 |
| 5 | carbon black | 0.7 – 1.0 |

EXAMPLE 3

68 g. of chlorendic acid anhydride (0.2 mole) and 28.4 g. of glycidyl methacrylate (0.2 mole) were added to 65 g. of trimethylolpropane triacrylate, and 0.3 g. of benzyl triethylammonium chloride as a catalyst and 0.1 g. of hydroquinone monoethylether as a thermalpolymerization inhibitor were added to the mixiture, after which the commponents were reacted at from 100°C to 120°C for 2 hours. The obtained varnish had an acid value of 14.4 and a viscosity of 1600 poise at 24°C.

The photocurable composition was completed in the following manner: 1 part by weight of ethyleneglycol diacrylate (In Experiment No. 1, this monomer was not added and in Experiment No. 7, the amount used was 2 parts.), 0.5 part by weight of benzoinethylether (In Experiment No. 1, the amount used was 2 percent by weight of the varnish, and in Experiments Nos. 6 and 7, an amount used was 1 part.) and 1 part by weight of the coloring agent (In Experiment 6, the amount used was 0.5 part.) were added to 7.5 parts by wewight of the varnish (In Experiment 7, the amount used was 5.5 parts). Further, in Experiment No. 7, 1 part by weight of triallylisocyanulate was added.

After the obtained composition was coated on a tin plate to give a film thickness of 30 μ, it was exposed to a 500 watt high pressure mercury lamp at a distance of 30 cm., and the curing time was measured. The obtained results were shown in Table 3.

Table 3

| Experiment No. | Coloring Agent | Curing Time (Sec) |
|---|---|---|
| 1 | — | 0.3 |
| 2 | carmine lake | 0.5 |
| 3 | victoria blue | do. |
| 4 | phthalocyanine blue | do. |
| 5 | hansa yellow | do. |
| 6 | carbon black | do. |
| 7 | carmine lake | do. |

EXAMPLE 4

138 g. of chlorendic acid anhydride (0.4 mole), 28.4 g. of glycidyl methacrylate (0.2 mole), and another epoxy compound (0.2 mole) were added to trimethylolpropane triacrylate and 0.3 g. of benzyltriethylammonium chloride and 0.1 g. of hydroquinone monoethylether (In Experiments Nos. 2, 3 and 4, the amount used was 0.2 g.) were added to the mixture, after which the components were reacted at from 100°C to 120°c for 2 hours.

The photocurable composition was prepared by adding 2 percenet by weight of benzoinethylether to the obtained varnish. After the obtained composition was coataed on a tin plate to give a film thickness of 30μ, it was exposed to a 500 watt high pressure mercury lamp at a distance of 30 cm., and the curing time was measured. The obtained results are shown in Table 4. In this table, "Carjula-E" is a compound having epoxy gram equivalents of 245 and it is shown as the general formula:

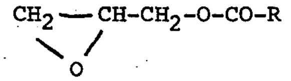

where R is an alkyl group, and "Adecaglycelol-ED501" is a compound having epoxy gram equivalents of 315 and it is shown as the general formula:

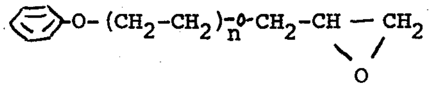

Table 4

| Experiment No. | Epoxy Compound | Trimethylol propanetriacrylate | Viscosity of varnish (poise at 25°C) | Acid value | Curing Time (Sec) |
|---|---|---|---|---|---|
| 1 | phenylglycidylether 30 g. | 129 g. | 1500 | 14.8 | 0.3 |
| 2 | buthylglycidylether 26 | 128 | 390 | 13.3 | do. |
| 3 | Carjula-E, 49 g. | 141 | 690 | 12.5 | 0.3 |
| 4 | Adecaglycelol-ED501,63 g. | 153 | 330 | 12.2 | do. |

EXAMPLE 5

100 g. of succinic acid anhydride (1 mole), 71 g. of glycidyl methacrylate (0.5 mole), and 75 g. of phenylglycidylether (0.5 mole) were reacted in the presence of 0.5 g. of benzyltriethylammonium chloride and 0.2 g. of hydroquinone monomethylether at from 100°C to 120°C for 3 hours. A polyester having an acid value of 32 and a viscosity of 4000 poise at 24°C was obtained.

A photocurable composition was prepared by adding photopolymerizable monomer, photopolymeriziation initiator and coloring agent to the obtained polyester. After the obtained photocurable composition was coated on a tin plate to give a film thickness of 30$\mu$, it was exposed to a 500 watt high pressure mercury lamp at a distance of 30 cm., and the curing time was measured. The obtained results are shown in Table 5.

Further, the photocurable composition was prepared by adding 2 percent by weight of benzoinethylether to the obtained polyester, and the composition was exposed in the same manner as in Example 1. The curing time was 0.3 second.

EXAMPLE 6

A mixture of 50 g. of succinic acid anhydride (0.5 mole), 71 g. of glycidyl methacrylate (0.5 mole), 65 g. of trimethylolpropane triacrylate, 0.4 g. of benzyltriethylammonium chloride and 0.1 g. of hydroquinone monomethylether was reacted at from 100°C to 120°C for 3 hours, after which a varnish having an acid value of 83 and a viscosity of 12 poise at 24°C was obtained. A photocurable composition was prepared by adding 2 percent (by weight) of benzoinethylether to the ob- Table 5

| Experiment No. | Polyester (Parts by wt.) | Photopolymerizable Monomer (Parts by wt.) | | Photopolymerization (Parts by wt.) | | Coloring Agent (Parts by wt.) | Curing Time (Sec) |
|---|---|---|---|---|---|---|---|
| 1 | 8 | 2-ethylhexyl-acrylate | 1.8 | benzoin-ethyl-ether | 0.2 | — | 0.6 |
| 2 | do. | butylacrylate | do. | do. | do. | — | do. |
| 3 | do. | methylmeth-acrylate | do. | do. | do. | — | do. |
| 4 | do. | styrene | do. | do. | do. | — | 15 |
| 5 | do. | N-vinyl-pyrrolidone | do. | do. | do. | — | 0.3 |
| 6 | do. | trimethylol-propanetri-methacrylate | do. | do. | do. | — | do. |
| 7 | do. | trimethylol-propanetri-acrylate | do. | do. | do. | — | do. |
| 8 | do. | ethyleneglycol diacrylate | do. | do. | do. | — | do. |
| 9 | do. | nonethylenegly-col diacrylate | do. | do. | do. | — | do. |
| 10 | do. | n-butoxymethyl-ol acrylamide | do. | do. | do. | — | 0.6 |
| 11 | 7 | 2-ethylhexyl-acrylate | 1.5 | benzoin-isobutyl ether | 0.7 | carmine lake 0.8 | 1.0 |
| 12 | do. | butylacrylate | do. | do. | do. | do. | do. |
| 13 | do. | methylmeth-acrylate | do. | do. | do. | do. | do. |
| 14 | do. | styrene | do. | do. | do. | do. | 15 |
| 15 | do. | N-vinyl-pyrrolidone | do. | do. | do. | do. | 0.5 |
| 16 | do. | trimethylol-propanetri-methacrylate | do. | do. | do. | do. | do. |
| 17 | do. | trimethylol-propanetri-acrylate | do. | do. | do. | do. | do. |
| 18 | do. | ethylenegly-col diacrylate | do. | do. | do. | do. | do. |
| 19 | do. | nonethylenegly-col diacrylate | do. | do. | do. | do. | do. |
| 20 | do. | n-butoxymethyl-ol acrylamide | do. | do. | do. | do. | do. |
| 21 | 7 | ethylenegly-col diacrylate | 1.8 | benzoin-isobutyl ether | 0.7 | hansa yellow 0.8 | 0.5 |
| 22 | do. | trimethylol-propane tri-acrylate | do. | do. | do. | do. | do. |
| 23 | do. | trimethylol-propane tri-methacrylate | do. | do. | do. | do. | do. |
| 24 | do. | triallyliso cyanulate | do. | do. | do. | do. | do. |
| 25 | do. | diallyl-phthalate | do. | do. | do. | do. | do. |

tained varnish. Then the composition was exposed in the same manner as in Example 1. The curing time was 2 seconds.

EXAMPLE 7

A mixture of 100 g. of succinic acid anhydride (1 mole), 71 g. of glycidyl methacrylate (0.5 mole), 124 g. of Carjula-E (0.5 mole), 0.2 g. of triethylamine and 0.2 g. of hydroquinone monomethylether was reacted at from 100°C to 120°C for 3 hours. A polyester having an acid value of 15.8 and a viscosity of 730 poise at 24°C was obtained. A photocurable composition was prepared by adding 2 percent (by weight) the benzoinethylether to the obtained polyester. Then the composition was exposed in the same manner as in Example 1. The curing time was 0.5 second.

EXAMPLE 8

A mixture of 74 g. of phthalic acid anhydride (0.5 mole), 35 g. of glycidyl methacrylate (0.25 mole), 63 g. of Carjula-E (0.25 mole), 75 g. of trimethylolpropane triacrylate, 0.1 g. of triethylamine and 0.1 g. of hydroquinone monomethylether was reacted at from 100°C to 120°C for 2 hours. A varnish having an acid value of 12.9 and a viscosity of 1300 poise at 24°C was obtained. A photocurable composition was prepared by adding 2 percent (by weight) of benzoinethylether to the obtained varnish. The composition was exposed in the same manner as in Example 1. The curing time was 0.2 second.

EXAMPLE 9

A mixture of 50 g. of succinic acid anhydride (0.5 mole), 71 g. of glycidyl methacrylate (0.5 mole), 65 g. of trimethylolpropane triacrylate, 0.4 g. of benzyltriethylammonium chloride and 0.1 g. of hydroquinone monomethylether was reacted at from 100°C to 120°C for 3 hours. A varnish having an acid value of 60 and a viscosity of 12 poise at 24°C was obtained. A photocurable composition was prepared by adding 2 percent (by weight) of benzoinethylether to the obtained varnish. The composition was exposed in the same manner as in Example 1. The curing time was 2 seconds.

EXAMPLE 10

A mixture of 98 g. of maleic acid anhydride (1 mole), 71 g. of glycidyl methacrylate (0.5 mole), 123 g. of Carjula-E (0.5 mole), 0.5 g. of benzyltriethylammonium chloride and 0.1 g. of hydroquinone monomethylether was reacted at from 100°C to 120°C for 3 hours. A polyester having an acid value of 23.5 and a viscosity of 3600 poise at 24°C was obtained. A photocurable composition was prepared by adding photopolymerizable monomer, 0.2 part by weight of benzoinethylether (In Experiments Nos. 5 and 8, the amount used was 1 part.), and 1 part by weight of carmine lake (In Experiments Nos. 1 to 4, 6 and 7, the coloring agent was not added.) to the obtained polyester. Further, in Experiment 8, 1 part by weight of triallylisocyanulate resin was added. The obtained composition was exposed in the same manner as in Example 1. Results are shown in Table 6.

Table 6

| Experiment No. | Polyester (Parts by wt.) | Photopolymerizable Monomer (Parts by wt.) | | Curing Time (Sec) |
|---|---|---|---|---|
| 1 | 8 | trimethylolpropane triacrylate | 1.8 | 0.5 |
| 2 | do. | N-vinylpyrrolidone | do. | 0.3 |
| 3 | do. | triallylisocyanate | do. | 0.5 |
| 4 | do. | diallylphthalate | do. | do. |
| 5 | 7 | trimethylolpropane triacrylate | 1.0 | do. |
| 6 | do. | trimethylolpropane triacrylate<br>N-vinylpyrrolidone | 1.0<br>1.8 | 0.3 |
| 7 | do. | methylmethacrylate | 1.8 | 0.7 |
| 8 | 5 | trimethylolpropane triacrylate | 2.0 | 0.5 |

EXAMPLE 11

74 g. of phthalic acid anhydride (0.5 mole), 35 g. of glycidyl methylate (0.25 mole) and 38 g. of phenylglycidylether (0.25 mole) were dissolved in 63 g. of trimethylolpropane triacrylate, and 0.3 g. of triethylbenzylammonium chloride and 0.1 g. of hydroquinone monomethylether were added to the mixture. These components were reacted at 100°C for 3 hours. A varnish having an acid value of 43 and a viscosity of 4300 poise at 25°C was obtained. A photocurable composition was prepared by adding 2 percent (by weight) of benzoinethylether to the obtained varnish. The obtained composition was exposed in the same manner as in Example 1. The curing time was 0.2 second. The above described photocurable composition was allowed to stand under the light at room temperature for 1 month, and did not gel. Both viscosity and curing time of the composition, at that time, were almost the same as those shown 1 month previously.

It is claimed:

1. A photocurable composition comprising (a) a polyester having a repeating unit of the formula:

$$-CH_2-\underset{\displaystyle CH_2R'}{\underset{|}{CH}}-OOC-R-COO-$$

wherein R is an acid residue of a polycarboxylic acid selected from the group consisting of succinic acid, phthalic acid, chlorendic acid, trimellitic acid, pyromellitic acid, nadic acid, methyl nadic acid, tetrahydrophthalic acid, hexahydrophthalic acid and tetrachlorophthalic acid, and R' is a carbonyloxy group selected from the group consisting of acryloyloxy group, methacryloyloxy group, crotonoyloxy group and cinnamoyloxy group, and (b) a photopolymerization initiator selected from the group consisting of 2-alkylanthraquinone, benzoin, benzoin ester, benzoin ether, benzoin thioether, decyl chloride, benzoin — Michler's ketone and N,N-dialkylaniline — alkyl halide.

2. A photocurable composition as defined in claim 1, wherein said composition includes a photopolymerizable monomer selected from the group consisting of acrylic acid ester monomer and methacrylic acid ester monomer.

3. A photocurable composition as defined in claim 2, wherein the photopolymerizable monomer is employed in the amount of up to about 70 percent by weight of the total composition.

4. A method of preparing a polyester directly in the form of a solvent solution in which the polyester has a repeating unit of the formula:

$$-CH_2-\underset{\displaystyle CH_2R'}{CH}-OOC-R-COO-$$

wherein R is an acid residue of a polycarboxylic acid selected from the group consisting of succinic acid, phthalic acid, chlorendic acid, trimellitic acid, pyromellitic acid, nadic acid, methyl nadic acid, tetrahydrophthalic acid, hexahydrophthalic acid and tetrachlorophthalic acid, and R′ is a carbonyloxy group selected from the group consisting of acryloyloxy group, methacryloyloxy group, crotonoyloxy group and cinnamoyloxy group, and method consisting of copolymerizing a glycidyl ester selected from the group consisting of glycidyl acrylate, glycidyl methacrylate, glycidyl crotonate and glycidyl cinnamate, with a polycarboxylic acid anhydride selected from the group consisting of succinic acid anhydride, phthalic acid anhydride, chlorendic acid andhydride, trimellitic acid anhydride, pyromellitic acid anhydride, nadic acid anhydride, methyl nadic acid anhydride, tetrahydrophthalic acid anhydride, hexahydrophthalic acid anhydride and tetrachlorophthalic acid anhydride, in a solvent medium selected from the group consisting of acrylic acid ester and methacrylic acid ester.

5. A method of preparing a photocurable composition, comprising (a) a polyester having a repeating unit of the formula:

$$-CH_2-\underset{\displaystyle CH_2R'}{CH}-OOC-R-COO-$$

wherein R is an acid residue of a polycarboxylic acid selected from the group consisting of succinic acid, phthalic acid, chlorendic acid, trimellitic acid, pyromellitic acid, nadic acid, methyl nadic acid, tetrahydrophthalic acid, hexahydrophthalic acid and tetrachlorophthalic acid, and R′ is a carbonyloxy group selected from the group consisting of acryloyloxy group, methacryloyloxy group, crotonoyloxy group and cinnamoyloxy group, (b) a photopolymerizable monomer solvent selected from the group consisting of acrylic acid ester and methacrylic acid ester, and (c) a photopolymerization initiator selected from the group consisting of 2-alkylanthraquinone, benzoin, benzoin ester, benzoin ether, benzoin thioether, decyl chloride, benzoin - Michler's ketone and N,N-dialkylaniline - alkyl halide, the method consisting essentially of first preparing a polyester directly in the form of a solvent solution by copolymerizing a glycidyl ester selected from the group consisting of glycidyl acrylate, glycidyl methacrylate, glycidyl crotonate and glycidyl cinnamate, with a polycarboxylic acid anhydride selected from the group consisting of succinic acid anhydride, phthalic acid anhydride, chlorendic acid anhydride, trimellitic acid anhydride, pyromellitic acid anhydride, nadic acid anhydride, methyl nadic acid anhydride, tetrahydrophthalic acid anhydride, hexahydrophthalic acid anhydride and tetrachlorophthalic acid anhydride, in said photopolymerizable monomer solvent, and thereafter mixing the resulting polyester solvent solution with said photopolymerization initiator.

* * * * *